(12) United States Patent
Patterson et al.

(10) Patent No.: US 10,295,283 B2
(45) Date of Patent: May 21, 2019

(54) THERMAL MANAGEMENT USING PHASE CHANGE MATERIAL

(71) Applicant: Intel Corporation, Santa Clara, CA (US)

(72) Inventors: Michael K. Patterson, Olympia, WA (US); Andrew C. Alduino, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 550 days.

(21) Appl. No.: 14/974,801

(22) Filed: Dec. 18, 2015

(65) Prior Publication Data

US 2017/0176118 A1 Jun. 22, 2017

(51) Int. Cl.
| *F28F 27/00* | (2006.01) |
| *F28D 20/02* | (2006.01) |
| *H01L 23/34* | (2006.01) |
| *H01L 23/427* | (2006.01) |
| *G02B 6/00* | (2006.01) |
| *G02B 6/42* | (2006.01) |
| *F28D 21/00* | (2006.01) |

(52) U.S. Cl.
CPC .............. *F28F 27/00* (2013.01); *F28D 20/02* (2013.01); *G02B 6/00* (2013.01); *G02B 6/4268* (2013.01); *H01L 23/427* (2013.01); *H01L 23/4275* (2013.01); *F28D 2021/0029* (2013.01); *H01L 23/34* (2013.01); *Y02E 60/145* (2013.01)

(58) Field of Classification Search
None
See application file for complete search history.

(56) References Cited

U.S. PATENT DOCUMENTS

| 8,145,017 | B2 * | 3/2012 | Tanaka | G02B 6/12007 385/14 |
| 2009/0001336 | A1 * | 1/2009 | Habib | G01K 7/16 257/2 |
| 2011/0127024 | A1 * | 6/2011 | Patel | G06F 1/20 165/200 |
| 2018/0120911 | A1 * | 5/2018 | Han | G03B 17/55 |

* cited by examiner

*Primary Examiner* — Michelle R Connelly
(74) *Attorney, Agent, or Firm* — Schwegman Lundberg & Woessner, P.A.

(57) ABSTRACT

Generally discussed herein are devices and methods for thermal management of a component. An apparatus can include a phase change material substantially at a phase transition temperature of the phase change material, a component near, on, or at least partially in the phase change material, and a heat removal device to transfer heat energy away from the phase change material and maintain the phase change material substantially at the phase transition temperature.

22 Claims, 7 Drawing Sheets

THERMAL MANAGEMENT USING PHASE CHANGE MATERIAL

TECHNICAL FIELD

Examples generally relate to systems and methods for managing a temperature of a component using a phase change material.

BACKGROUND

The performance, and perhaps in at least some cases the viability, of some optical interconnect architectures can be sensitive to a temperature stability of the optical components. For example, a silicon photonics Wavelength Division Multiplexed (WDM) architecture, which shows promise to provide a high bandwidth and low power optical solution, may require a rather precise temperature control (e.g., on the order of within about 0.5° C. variation) for reliable performance. The requirements of a thermal management solution capable of providing such a temperature control are challenging not only because the power dissipated as heat in the optical components must be effectively controlled, but also because both ends of the optical path may need to be at or near the same temperature as the control temperature to help ensure the proper control. These requirements are further complicated by the start-up phase of the system, where all the components are at essentially room or ambient temperature and will then heat up to their operating temperature. Additionally, the temperature of the individual components may vary based upon utilization (idle to peak or thermal design power (TDP)) or even natural or programmed room temperature changes.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Examples in this disclosure relate generally to temperature management devices and methods. In one or more embodiments a component is on, at least partially in, or near a phase change material that is in a phase transition state so as to help manage the temperature of the phase change material.

State-of-the-art thermal management system solutions are generally limited to "less than" concepts (i.e. if a component includes a temperature greater than a specified threshold, the component is cooled until it is below the specified threshold) or within a few degrees of a temperature setpoint, such as is provided in home heating and cooling systems.

Current thermal management solutions generally do not have an "equal to" capability. Such an "equal to" capability can help optimize the performance of the thermal management system. That is, current optical component thermal management system solutions are generally designed to keep components below their upper specified thermal limit. The temperature is generally specified as either a case or junction temperature; Tcase or Tj respectively. Any temperature value below a maximum defined limit is deemed acceptable. A lower limit to the temperature can be defined to be a lower ambient temperature (e.g., 5° C. allowable Data Center American Society of Heating, Refrigerating, and Air-Conditioning Engineers (ASHRAE) class A3 or A4) up to case or junction temperatures nominally in the 70° C. to 85° C. range. Currently there is no known solution for a temperature management system to provide temperature control within 0.5° C. of a specified control temperature.

Further complicating the challenge to provide this sort of stable temperature environment, such as for a temperature sensitive component (e.g., a silicon photonics component or any other temperature sensitive component), is the lack of accuracy and precision available from affordable temperature sensors. Typical information technology (IT) platform and silicon sensors are accurate to within about ±2 or 3° C. range at best. With the currently available temperature sensors capable of monitoring the temperature accurately enough to keep two components within 0.5° C. of each other, even if a thermal management system capable of providing such stability were possible, the sensing instrumentation would add a very significant cost to the overall system.

Figure 1:
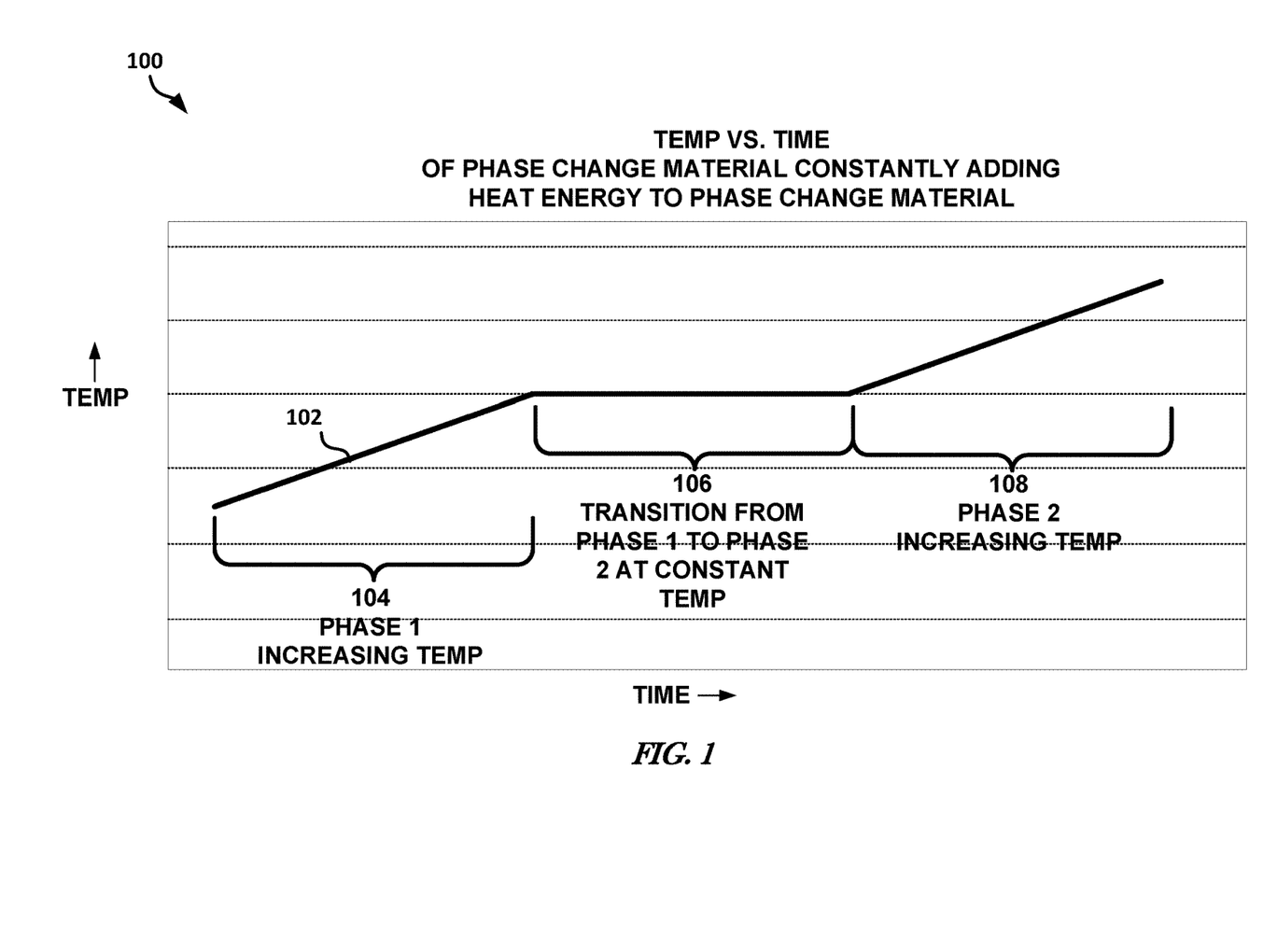
FIG. 1 illustrates, by way of example, a graph of temperature of a phase change material versus time with heat energy being added to the phase change material.

A possible solution to achieving temperature regulation to within about 0.5° C. includes using a phase change material at a phase transition temperature to help regulate the temperature. FIG. 1 illustrates, by way of example, a graph 100 of temperature versus time of a phase change material with heat energy being added thereto over time. The graph 100 includes a line 102 with three regions 104, 106, and 108. As is illustrated in the graph 100, as energy is added to a phase change material its temperature will increase, with the rate of the increase being dependent on the specific heat of the material and a current state of the phase change material (i.e. whether the material is in a phase or transitioning between phases). When the material reaches a temperature at which a phase change occurs however, such as from a solid to a liquid or from a liquid to a vapor, significant amounts of energy can be added to the system without any significant change in the temperature (e.g., a temperature change of less than 0.5° C.) of the material since the additional energy is consumed in the change of the material's physical composition from phase 1 to phase 2.

The first region 104 corresponds to the temperature of the phase change material when it is in a first phase. A phase of the phase change material is a solid, liquid, or a vapor (sometimes called a gas phase). A phase change material is a material that changes phase by changing the temperature of the phase change material beyond a phase change temperature. A material can change phase from a solid to a liquid or from a liquid to a gas as temperature increases. As temperature decreases, the phase of a phase change material can change from a gas to a liquid or from a liquid to a solid.

Referring back to FIG. 1, the temperature of the material increases in the first phase (as is depicted in the region 104) until the material reaches a phase transition temperature. For example, consider water in liquid form being heated to about 100° C. (the transition temperature at which water converts from liquid to steam). The region 104 in this example corresponds to the temperature of the liquid water between 0 and 100° C.

The region 106 corresponds to the temperature of the phase change material being at a transition temperature (a temperature at which the material is changing from a phase 1 state to a phase 2 state). The region 106 shows that the temperature of the phase change material remains generally constant even with the added heat energy. Thus, significant amounts of energy can be added or removed from the phase change material while in the region 106 with the temperature of the phase change material remaining generally constant. The region 108 corresponds to temperature of the phase change material after the phase change material has transitioned from being in the first phase to being in the second phase. A phase change material in the second phase will increase in temperature (as is illustrated in the region 108). The temperature will increase until the phase change material reaches another phase change temperature (if possible). Consider the previous example of water in liquid phase being heated. The region 106 corresponds to the liquid water just before the water turns to steam phase at 100° C. and the region 108 corresponds to the water being in the gas phase (steam).

A phase change material at a transition temperature (a temperature in the region 106) has a more stable temperature (a larger heat capacity) than the phase change material at a non-transition temperature. That is, it takes more energy to raise the temperature of a phase change material through the transition temperature than to raise the temperature of the phase change material in either of the regions 104 and 108. These properties of the phase change material can be exploited to help maintain the temperature of a component at or near a transition temperature of a phase change material. With the increased heat capacity of the phase change material at the transition temperature, the phase change material can absorb or lose more heat energy without changing temperature than the phase change material can absorb or lose without changing temperature at a non-transition temperature. This phase change or change in the physical state of the phase change material occurs at a generally constant temperature. Only after the material has converted to the next material phase will the temperature again increase as more energy is added to the system, as shown in the graph 100 at 108.

Figure 2:
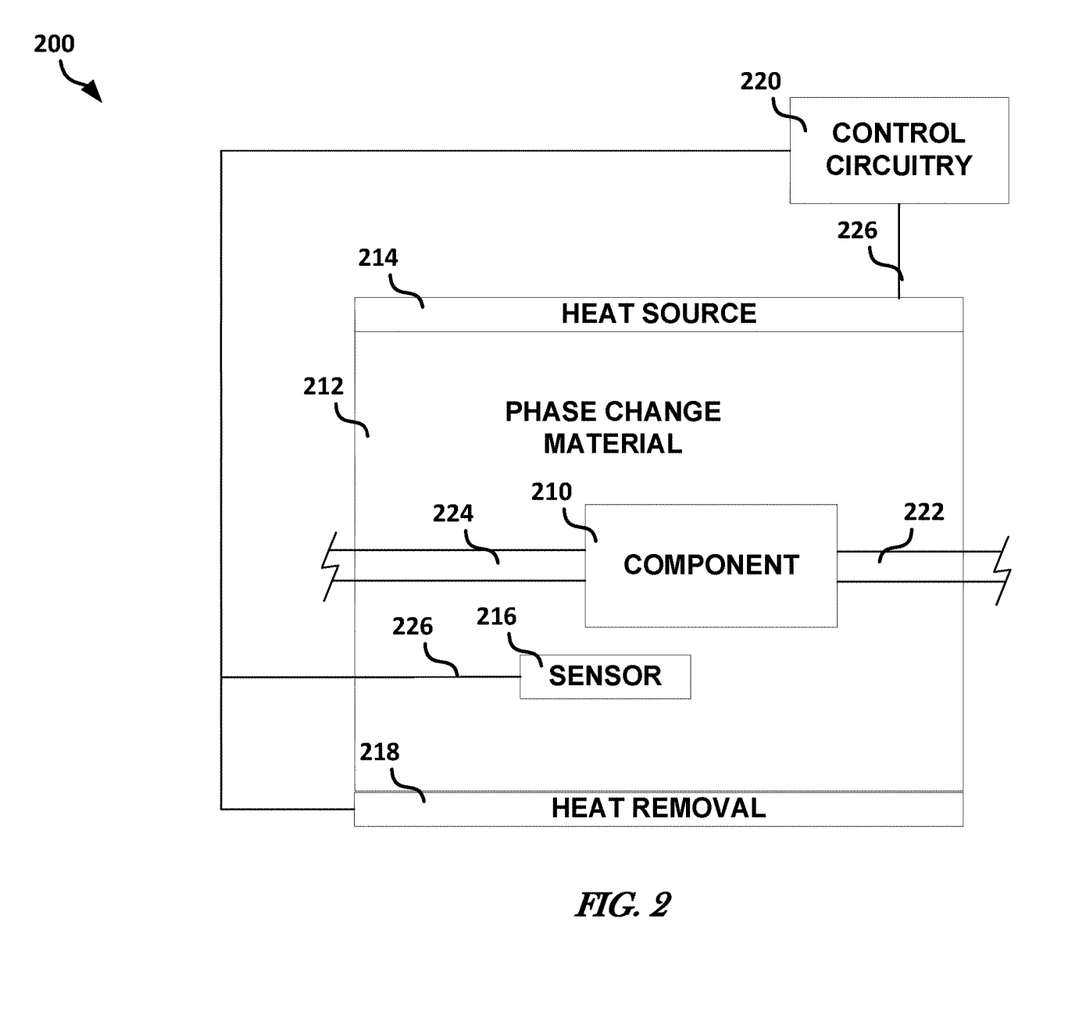
FIG. 2 illustrates, by way of example, a block diagram of an embodiment of a temperature management system to manage a temperature of a component.

FIG. 2 illustrates, by way of example, a block diagram of an embodiment of a temperature management system 200 to manage a temperature of a component 210. The system 2000 as illustrated includes a component 210 on, near, or at least partially in a phase change material 212. The system 200 as illustrated includes a heat source 214 on, near, or at least partially in the phase change material 212. The system 200 as illustrated includes a sensor 216 on, near, or at least partially in the phase change material 212. The system 200 as illustrated includes a heat removal device 218 on, near, or at least partially in the phase change material 212. The system 200 as illustrated includes control circuitry 220 electrically coupled to the heat source 214, sensor 216, and heat removal device 218 through electrical connections 226.

The component 210 as illustrated is coupled to an input port 222 and an output port 224, such as to power or drive the component and receive and output signal from the component 210, respectively.

The component 210 can be a device or material whose operation characteristic(s) is sensitive to temperature. In one or more embodiments, the component 210 can include a silicon photonics device, such as a light modulation device (e.g., a ring resonator), an electric or electronic component.

The phase change material 212 can be a material in a solid, liquid, gas, or a transition phase. The phase change material 212 can include a conductive material or a dielectric material. The phase change material 212 can include a wax, oil, epoxy or other polymer, an adhesive (e.g., solder or other conductive adhesive), and so forth. The phase change material 212 can be selected so as to have a phase transition that occurs at a temperature at which the component 210 is to operate.

The heat source 214 is a device that adds heat energy to the phase change material 212. The heat source 214 can provide an increase in temperature by providing heat energy at a temperature greater than a current temperature of the phase change material 212. The heat source 214 can provide a decrease in temperature by providing heat energy at a temperature less than a current temperature of the phase change material 212. The heat source 214 can be an electric heater, a water heater, a chemical heater, and so forth.

The sensor 216 is a device that detects a specific property of the phase change material 212. The sensor 216 can be an electric property sensor (e.g., a resistivity or conductance sensor), a pressure sensor (e.g., a piezoelectric sensor, a nuclear density gauge, a load cell), or a temperature sensor (e.g., a thermistor, a quartz thermometer, a silicon bandgap temperature sensor, and so forth).

The heat removal device 218 is a material that transfers heat away from the phase change material 212. As the component 210 is operating and/or heat, such as from the heat source 214 or the connections 226, input 222, or output 224, is provided the phase change material 212 can absorb heat energy. The heat removal device 218 or heat source 214 can help dissipate this absorbed heat energy by transferring heat energy to a surrounding environment. The heat removal device 218 can be a heat sink, such as a finned metal structure, a wire mesh, or other non-electric heat transfer mechanism, or an electric heat transfer mechanism, such as a fan or liquid cooler, and so forth. In embodiments in which the heat source 214 is capable of cooling or is capable of adding heat energy so as to only offset the heat dissipated from the system 200 and retain the temperature of the phase change material 212 without cooling, the heat removal device 218 can be superfluous and left out of the system 200.

The control circuitry 220 receives signals from the sensor 216 that indicate a state or value of a property of the phase change material 212. The control circuitry 220 can then determine whether to increase, decrease, or neither the heat energy being provided from the heat source 214 based on the signal(s) provided by the sensor 216. The control circuitry 220 can, in response to receiving one or more signals from the sensor 216, control an electric heat removal source (e.g., the heat removal device 218 or the heat source 214) accordingly.

The control circuitry 220 can include one or more electric or electronic components (e.g., transistor, resistor, capacitor, diode, inductor, processor, such as a central processing unit, a radio (e.g., a transmit radio, a receive radio, or a transceiver), Boolean logic gates, oscillator, multiplexer, switch, light, speaker, and so forth) configured to perform the operations of receiving signals and controlling the heat source 214 and/or the heat removal device 218 accordingly (e.g., by virtue of electrical connections and providing electro potential/current thereto and/or programming).

The input 222 can provide input stimulus to the component 210. In one or more embodiments in which the component 210 is a silicon photonics component or other light sensitive component, the input 222 can carry light, such as an optical fiber or other optical waveguide. In one or more embodiments in which the component 210 is an electric or electronic component the input 222 can include a conductive element (e.g., a wire, cable, or trace, and so forth), or other mechanism capable of carrying an electro potential to the component 210, such as can include a wireless transmission medium.

The output 224 can carry a signal away from the component 210. The output 224 can be an optical waveguide, such as when component produces or modulates light, or a conductive element capable of carrying an electro potential away from the component 210 in instances in which the component 210 produces an electro potential in response to the stimulus from the input 222.

The connections 226 can be wired or wireless connections. Wireless connections are typically provided by components including corresponding radio transmitters, receivers, or transceivers. Thus, the heat source 214, the heat removal device 218, control circuitry 220, and/or the sensor 216 may include a corresponding radio to facilitate wireless communication between the components.

Using the system 200, the phase change material 212 can be brought to a temperature at or near a phase transition temperature. The heat energy transfer between the phase change material 212 and the component 210 can be such that the temperature of the phase change material 212 and the component 210 will be the same or nearly the same (e.g., within about 0.5° C.). The heat energy transfer characteristic between the phase change material 212 and the component 210 can be changed by moving the two items relative to one another, embedding the component 210 more or less in the phase change material 212, and/or surrounding the component 210 more or less with the phase change material 212.

The sensor 216 detects a property of the phase change material 212 that changes with temperature and relays signals (via the connection 226) that indicate that property of the phase change material 212 to the control circuitry 220. The control circuitry 220 is configured to activate or otherwise control the behavior of the heat source 214 and/or the heat removal device 218 to attempt to keep the data from the sensor 216 within a certain range. The range of values that are acceptable correspond to values of the property of phase change material 212 that indicate the phase change material 212 is in a transition phase (i.e. at a temperature corresponding to the region 106, see FIG. 1).

In this manner, the system 200 provides the ability to keep the component 210 at a stable temperature (the transition temperature of the phase change material 212). The increased heat capacity of the phase change material 212 allows for a wider range of heat to be absorbed by the phase change material 212 without changing the phase (and the temperature) of the phase change material.

An advantage of this system is that multiple components can all be maintained at the transition temperature of the phase change material, such as to make the temperature homogenous across components, such as components in a data center or across a cluster of components. Such a generally homogenous temperature can be achieved by situating the components on, near, or at least partially in phase change materials (e.g., the same phase change material) with the same phase transition temperatures and maintaining the phase change materials at that transition temperature, such as by using the systems and/or methods discussed herein. Such homogenous temperatures can help enable advanced photonics system and can also help enable systems that can benefit from one or more components being at or sufficiently near a specific temperature (within 0.5° C. of a specified temperature).

Figure 3:
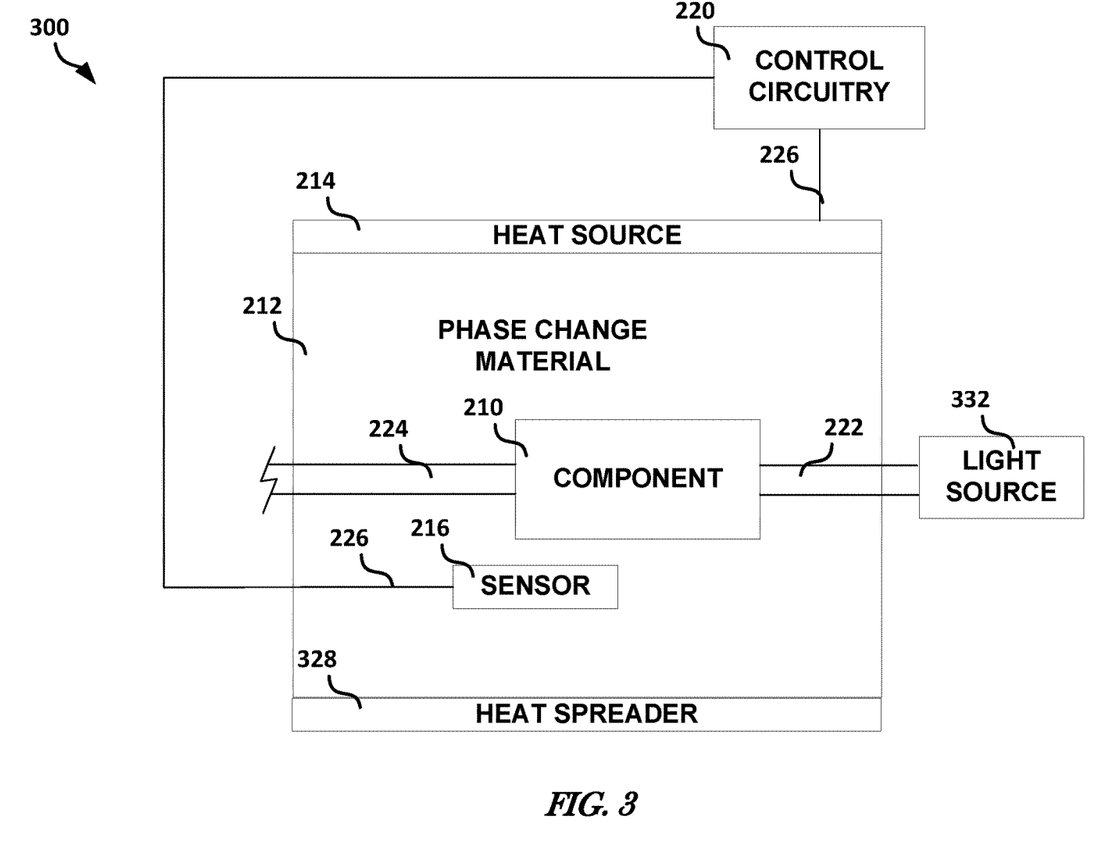
FIG. 3 illustrates, by way of example, a block diagram of another embodiment of a temperature management system to manage a temperature of a component.

FIG. 3 illustrates, by way of example, a block diagram of another embodiment of a temperature management system 300 to manage a temperature of the component 210. The system 300 as illustrated is similar to the system 200 with the system 300 including a heat spreader 328 and a light source, and not including the heat removal device 218. While the system 300, as illustrated, does not include the heat removal device 218 and the system 200, as illustrated, does not include the heat spreader 328, either system 200 and 300 can include both the heat removal device 218 and the heat spreader 328.

The heat spreader 328 is a device that disperses heat, such as heat energy from the heat source 214 or the phase change material 212, to other areas of the phase change material 212. The heat spreader 328 is a thermally conductive material, such as a metal, ceramic, polymer, or other thermally conductive material. The heat spreader 328 helps to provide heat energy more uniformly throughout the phase change material 212. Using the heat spreader 328, the temperature of the phase change material 212 can be adjusted more uniformly than embodiments without the heat spreader 328. In one or more embodiments, the heat spreader 328 is a thermally conductive mesh, such as a wire mesh material, on or at least partially in the phase change material 212. In one or more embodiments, the heat spreader 328 can be incorporated with the phase change material 212, such as to have the heat spreader at least partially embedded in the phase change material 212. In one or more embodiments, the heat spreader 328 occupies space within the phase change material 212.

The light source 332 is a device that provides optical waves to the port 222. The light source 332 can be a laser, a light emitting diode (LED), or other light producing device.

Figure 4:
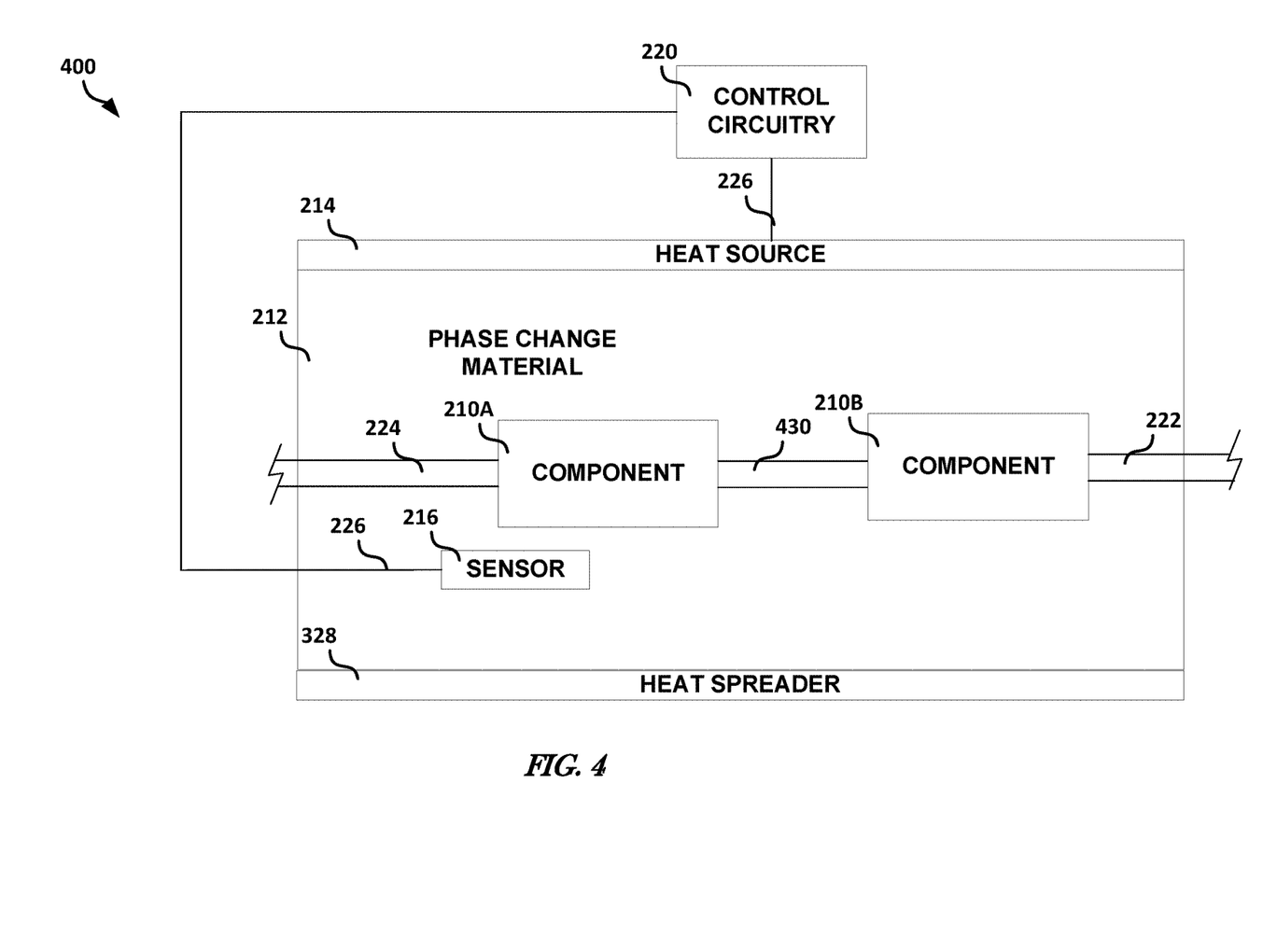
FIG. 4 illustrates, by way of example, a block diagram of another embodiment of a temperature management system to manage a temperature of multiple components.

FIG. 4 illustrates, by way of example, a block diagram of another embodiment of a temperature management system 400 to manage a temperature of multiple components 210A and 210B to retain the components 210A-B and/or their input and output ports at a generally homogenous temperature. The system 400 is illustrated as similar to the system 300 with the system 400 including two components 210A-B and corresponding input and output ports on, near, or at least partially embedded in the phase change material 212. Note that while the system 400 is illustrated as including a single heat source 214, and a single heat spreader 328, a single sensor 216, and a single phase change material 212, one or more of such components can be used in the system 400. For example, the component 210A can be thermally coupled to a first phase change material that is thermally coupled to a first heat source, a first heat removal device, and/or a first heat spreader and the component 210B can be thermally coupled to a second phase change material (same or different material from the first phase change material) that is thermally coupled to a second heat source, a second heat removal device, and/or a second heat spreader. The connection 430 can be similar to the input port 222 and/or the output port 224.

Figure 5:
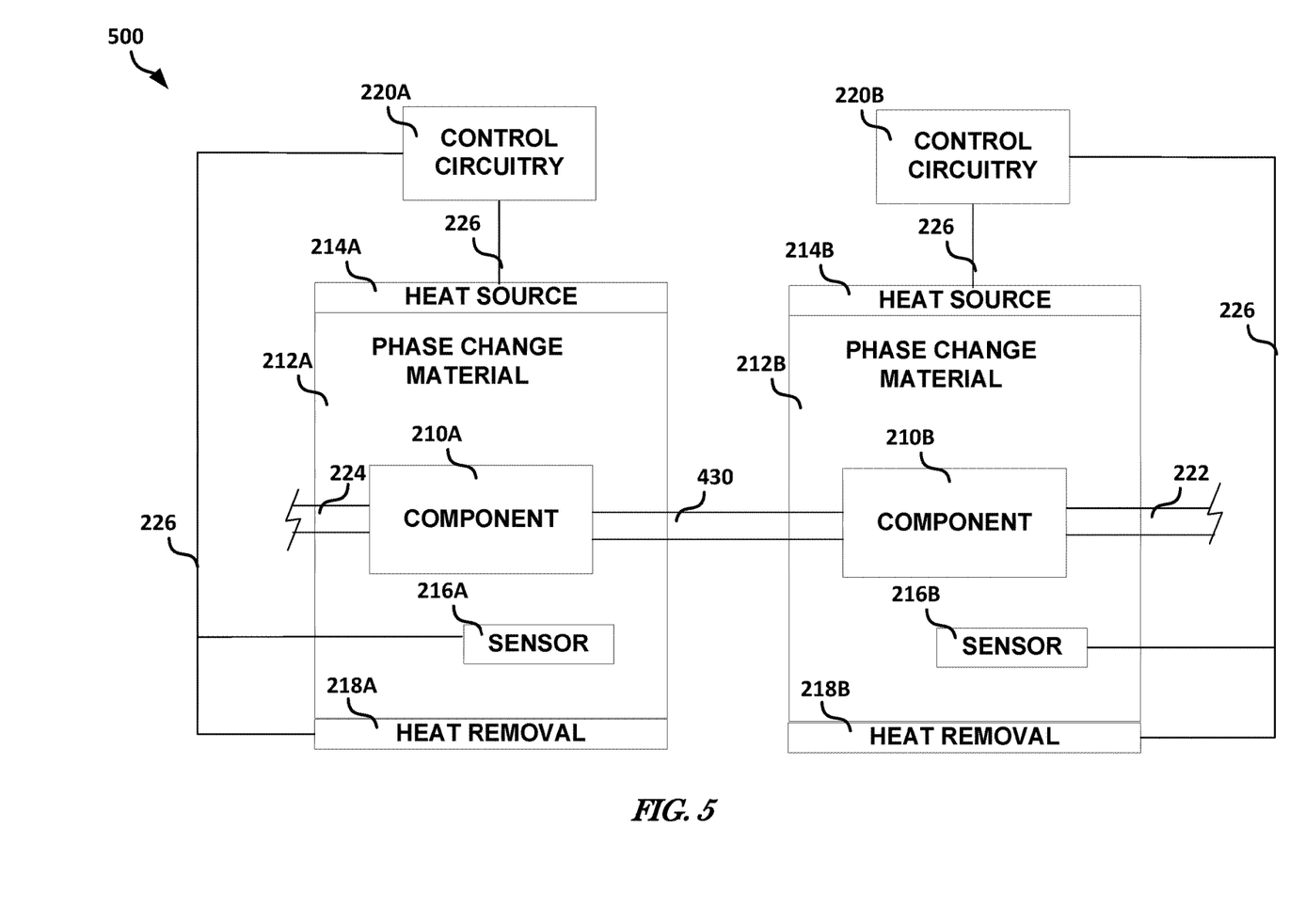
FIG. 5 illustrates, by way of example, a block diagram of another embodiment of a temperature management system to manage a temperature of multiple components.

FIG. 5 illustrates, by way of example, a block diagram of another embodiment of a temperature management system 500 to manage a temperature of multiple components 210A and 210B to retain the components 210A-B and/or their input and output ports at a generally homogenous temperature. The system 500 is illustrated as similar to the system 400 with the system 500 including multiple discrete phase change materials 212A and 212B and discrete temperature control systems (e.g., control circuitry 220A and 220B, sensor 216A and 216B, heat source 214A and 214B, and heat removal device 218A and 218B, respectively). The discrete phase change materials 212A-B are coupled through the connection 430 which is at least partially exposed to an external environment (i.e. outside the phase change material 212A-B). A temperature of the connection 430 in the region that is exposed will likely be different than the temperature of the connection 430 in the phase change material 212A-B. However, if the phase change materials 212A and 212B are the same material and the control circuitry 220A and 220B are programmed to keep the phase change material 212A-B in the phase transition region 106 (see FIG. 1) the temperature of the components 210A and 210B will be substantially the same as will the temperatures of the connection 430 and the input port 222 and output port 224 within the phase change material 212A-B. Using such a configuration, components 210A-B can be separated by a substantial distance and still be kept at substantially the same temperature.

Figure 6:
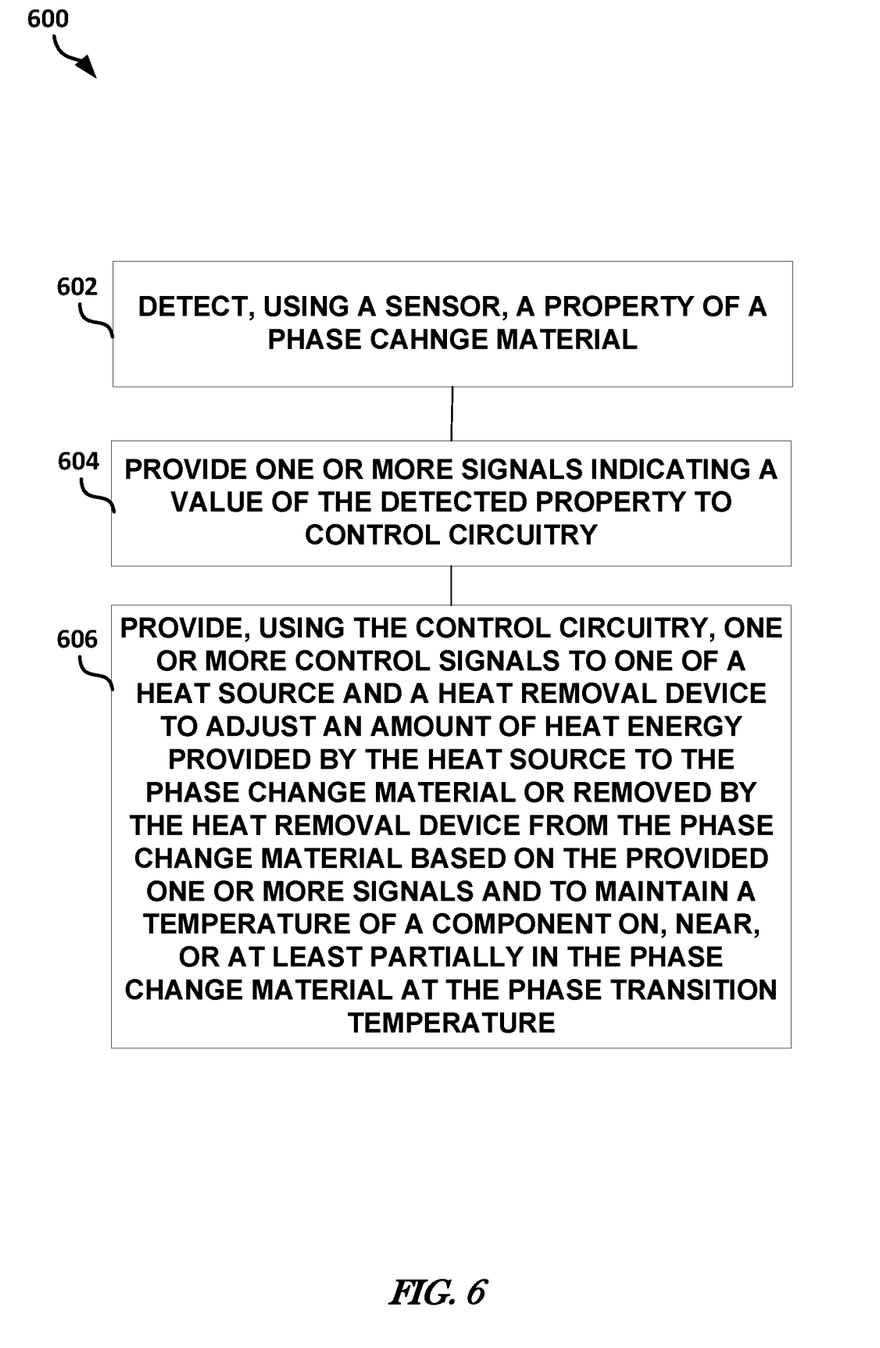
FIG. 6 illustrates, by way of example, a block diagram of a method of managing a temperature of one or more components.

FIG. 6 illustrates, by way of example, a diagram of an embodiment of a method 600 for thermal management of a temperature of a component. The method 600 as illustrated includes: detecting, using a sensor, a property of a phase change material, at operation 602; providing one or more signals indicating a value of the detected property to control circuitry, at operation 604; and providing, using the control circuitry, one or more control signals to one of a heat source and a heat removal device to adjust an amount of heat energy provided by the heat source to the phase change material or removed by the heat removal device from the phase change material based on the provided one or more signals, maintain the phase change material at or substantially at a phase transition temperature (e.g., within about 0.5° C. of the phase transition temperature), and maintain a temperature of a component on, near, or at least partially in the phase change material at or substantially at the phase transition temperature, at operation 606.

In one or more embodiments, the component is a silicon photonics component and the method 600 further includes receiving, at an optical waveguide, light from a light source and guiding, by the optical waveguide, the light to the silicon photonics component. In or more embodiments, the method 600 further includes providing, using the control circuitry, one or more control signals to a heat removal device to adjust an amount of heat energy transferred away from the phase change material by the heat removal device based on the provided one or more signals, maintain the phase change material at the phase transition temperature, and maintain a temperature of a component on, near, or at least partially in the phase change material at the phase transition temperature.

In one or more embodiments, the method 600 further includes dispersing heat energy from the heat source through the phase change material using a heat spreader. The method 600 can include, wherein the sensor is one of a pressure sensor and the property of the phase change material is a density and a resistivity sensor and the property of the phase change material is a conductivity.

Figure 7:
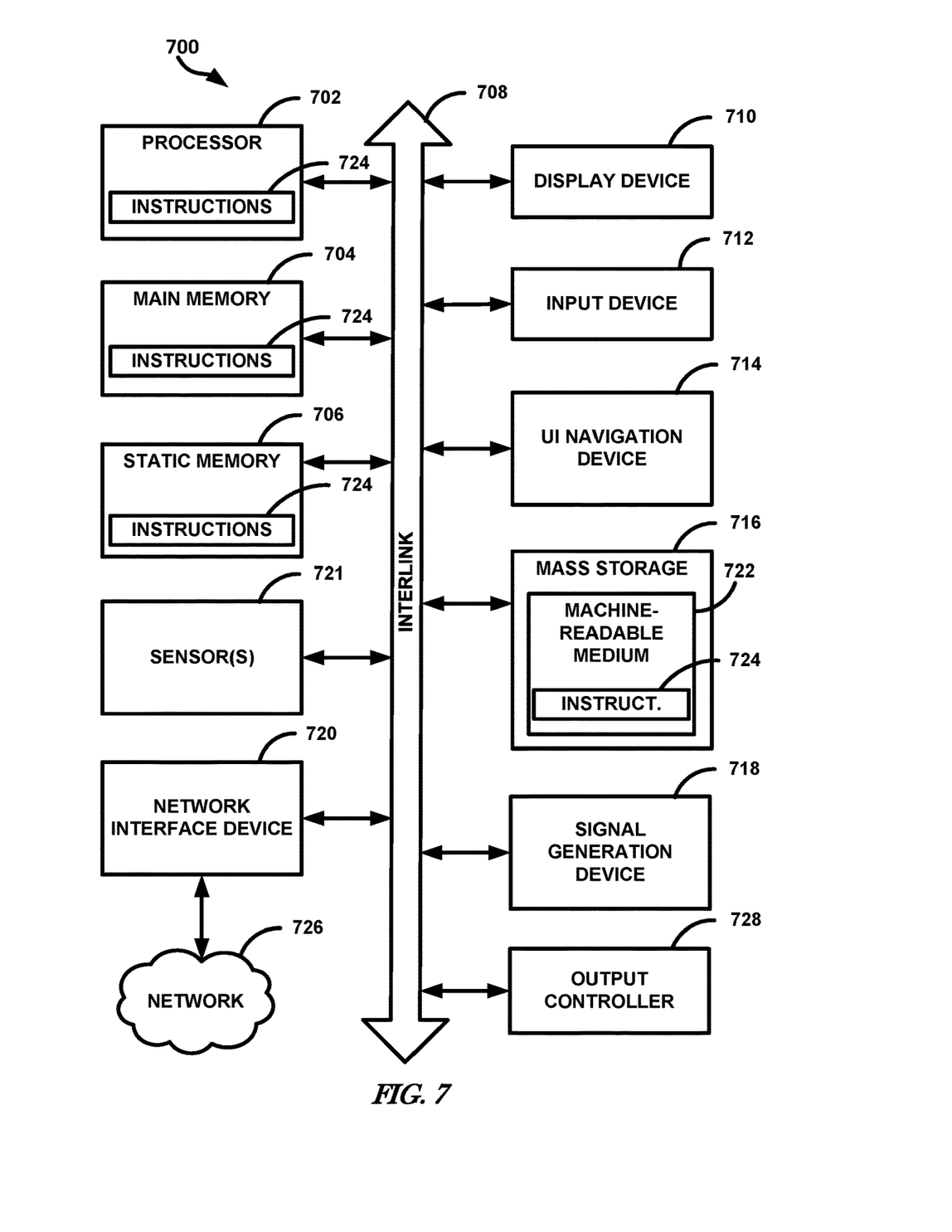
FIG. 7 illustrates, by way of example, a block diagram of an embodiment of a machine to perform operations of control circuitry.

FIG. 7 illustrates, by way of example, a block diagram of an embodiment of a machine 700 to perform operations of control circuitry, such as the control circuitry 220. One or more items of the machine 700 can be a part of the control circuitry 220. In alternative embodiments, the machine 700 operates as a standalone device or may be connected (e.g., networked) to other machines. Further, while only a single machine is illustrated, the term "machine" shall also be taken to include any collection of machines that individually or jointly execute a set (or multiple sets) of instructions to perform any one or more of the methodologies discussed herein.

The example machine 700 includes a processor 702 (e.g., a central processing unit (CPU), a graphics processing unit (GPU) or both), a main memory 704 and a static memory 706, which communicate with each other via a bus 708. The machine 700 may further include a video display unit 710 (e.g., a liquid crystal display (LCD) or a cathode ray tube (CRT)). The machine 700 may include an alphanumeric input device 712 (e.g., a keyboard), a user interface (UI) navigation device 714 (e.g., a mouse), a disk drive unit 716, a signal generation device 718 (e.g., a speaker) and a network interface device 720.

The memory 704 or 706 are examples of a storage device that can include instructions stored thereon that are executed by a machine, such as a processor or other processing circuitry, and cause the machine to perform operations. The storage device can be programmed and maintained prior to its inclusion in a BIT system. The instructions and other information can be encrypted or otherwise protected by one or more security measures, such as to help protect the operational boundaries and other data stored thereon.

The disk drive unit 716 includes a machine-readable medium 722 on which is stored one or more sets of instructions and data structures (e.g., software) 724 embodying or utilized by any one or more of the methodologies or functions described herein. The instructions 724 may also reside, completely or at least partially, within the main memory 704 and/or within the processor 702 during execution thereof by the computer system 700, the main memory 704 and the processor 702 also constituting machine-readable media.

While the machine-readable medium 722 is shown in an example embodiment to be a single medium, the term "machine-readable medium" may include a single medium or multiple media (e.g., a centralized or distributed database, and/or associated caches and servers) that store the one or more instructions or data structures. The term "machine-readable medium" shall also be taken to include any tangible medium that is capable of storing, encoding or carrying instructions for execution by the machine and that cause the machine to perform any one or more of the methodologies of the present invention, or that is capable of storing, encoding or carrying data structures utilized by or associated with such instructions. The term "machine-readable medium" shall accordingly be taken to include, but not be limited to, analog switches or circuits, solid-state memories, and optical and magnetic media. Specific examples of machine-readable media include non-volatile memory, including by way of example semiconductor memory devices, e.g., Erasable Programmable Read-Only Memory (EPROM), Electrically Erasable Programmable Read-Only Memory (EEPROM), and flash memory devices; magnetic disks such as internal hard disks and removable disks; magneto-optical disks; and CD-ROM and DVD-ROM disks.

The instructions 724 may further be transmitted or received over a communications network 726 using a transmission medium. The instructions 724 may be transmitted using the network interface device 720 and any one of a number of transfer protocols (e.g., File Transfer over TCP/IP, UDP, etc.). Examples of communication networks include a local area network ("LAN") and wireless data networks (e.g., WiFi and WiMax networks). The term "transmission medium" shall be taken to include any intangible medium that is capable of storing, encoding or carrying instructions for execution by the machine, and includes digital or analog communications signals or other intangible media to facilitate communication of such software.

Certain embodiments are described herein as including logic or a number of components, modules, or mechanisms. Examples of items that can be at least partially implemented using modules and described herein include the control circuitry 220, the heat source 214, the sensor 216, the heat removal device 218, the component 210, and/or the heat spreader 328. Modules may constitute either software modules (e.g., code embodied on a machine-readable medium) or hardware modules. A "hardware module" is a tangible unit capable of performing certain operations and may be configured or arranged in a certain physical manner. In various example embodiments, one or more computer systems (e.g., a standalone computer system, a client computer system, or a server computer system) or one or more hardware modules of a computer system (e.g., a processor or a group of processors) may be configured by software (e.g., an application or application portion) as a hardware module that operates to perform certain operations as described herein.

In some embodiments, a hardware module may be implemented mechanically, electronically, or any suitable combination thereof. For example, a hardware module may include dedicated circuitry or logic that is permanently configured to perform certain operations. For example, a hardware module may be a special-purpose processor, such as a Field-Programmable Gate Array (FPGA) or an Application Specific Integrated Circuit (ASIC). A hardware module may also include programmable logic or circuitry that is temporarily configured by software to perform certain operations. For example, a hardware module may include software executed by a general-purpose processor or other programmable processor. Once configured by such software, hardware modules become specific machines (or specific components of a machine) uniquely tailored to perform the configured functions and are no longer general-purpose processors. It will be appreciated that the decision to implement a hardware module mechanically, in dedicated and permanently configured circuitry, or in temporarily configured circuitry (e.g., configured by software) may be driven by cost and time considerations.

Accordingly, the phrase "hardware module" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented module" refers to a hardware module. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software accordingly configures a particular processor or processors, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple hardware modules exist contemporaneously, communications may be achieved through signal transmission (e.g., over appropriate circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions described herein. As used herein, "processor-implemented module" refers to a hardware module implemented using one or more processors.

In one embodiment, the modules are written in a computer-programming and/or scripting language. Examples of such languages include, but are not limited to, C, C++, C#, Java, JavaScript, Perl, Python, or any other computer programming and/or scripting language now known or later developed.

Similarly, the methods described herein may be at least partially processor-implemented, with a particular processor or processors being an example of hardware. For example, at least some of the operations of a method may be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an Application Program Interface (API)).

The performance of certain of the operations may be distributed among the processors, not only residing within a single machine, but deployed across a number of machines. In some example embodiments, the processors or processor-implemented modules may be located in a single geographic location (e.g., within a home environment, an office environment, or a server farm). In other example embodiments, the processors or processor-implemented modules may be distributed across a number of geographic locations.

In an example, the hardware can include configurable execution units (e.g., transistors, logic gates (e.g., combinational and/or state logic), circuits, etc.) and a machine readable medium containing instructions, where the instructions configure the execution units to carry out a specific operation when in operation. The configuring can occur under the direction of the executions units or a loading mechanism. Accordingly, the execution units (e.g., processing circuitry, such as can include one or more hardware processors, transistors, resistors, capacitors, inductors, state machines or other logic gates, multiplexers, radios, sensors or other electrical or electronic components) can be communicatively coupled to the machine readable medium when the device is operating. In this example, the execution units can be a user (e.g., personnel) of more than one module. For example, under operation, the execution units can be configured by a first set of instructions to implement a first module at one point in time and reconfigured by a second set of instructions to implement a second module. The modules can be implemented with the division of operations as explained herein or the division of operations can be different such that a single module implements one or more of the operations of two or more of the modules or multiple modules implement the operations of one of the modules.

As discussed herein, a component (e.g., an optical device or other temperature sensitive component) can be situated near or on, or at least partially in a phase change material as part of a thermal management system. When correctly designed and operated, the phase change material can help keep the component at the phase transition temperature of the phase change material, such as over a broad range of external temperatures (external to the phase change material and component) and component power dissipation regimes. An appropriate phase change material can be selected based on the desirable operating temperature range for the component. Future components and phase change materials can be designed to operate at this specific temperature and further optimize the overall system power efficiency, reliability, and/or bandwidth performance.

A phase change thermal management concepts discussed herein take advantage of the fact that there is a significant range of energy input over which the phase change material is not changing temperature but changing phase. It is at this temperature that the thermal management system is designed to operate. The systems, devices, and methods rely upon the energy capacity of the phase change material to keep the entire thermal solution and optical components at a generally constant temperature. This is accomplished by adding or removing heat energy from the phase change material to keep it in a 2-phase state (i.e. at the phase transition temperature in which the phase change material is partially in a first phase and partially in a second phase).

One challenge is devising a control system capable of adding or removing heat energy at the appropriate times to maintain the phase change material at the transition temperature. Multiple options are available for control systems to accomplish this function. For example, a control system can include a sensor embedded in the phase change material. The sensor can measure a specific physical property of the thermal system (e.g., the phase change material or environment around the phase change material) such as pressure, stress, or strain, depending upon the specifics of the implementation. If the phase change material has a different specific volume for the two different phases, one of the previously mentioned physical parameters may vary based on the portion of the material in either phase and the sensor can provide signals that can indicate when the phase change material is getting close to being either phase.

This control system can be configured to add or remove energy (e.g., heat energy) from the system in order to keep both phases ever-present in the phase change material. Another control strategy can be based on the electrical resistivity across the phase change material and/or the component. This strategy may work for some, but most likely not all potential phase change materials. To enable this control strategy a sensor can measure the resistivity across the material which can vary based upon the amount of the phase change material in each phase. As the range (percentage of the phase change material in each phase) changes, the resistivity can change. The control system can then alter the heat addition/removal to help ensure that the phase change material remains in a stable range of phase change, such as can be at a temperature away from a less stable temperature change regime, such as can include a non-transition phase.

Another advantage of one or more embodiments is the addition of a heat spreading material (e.g., the heat spreader 328) to the thermal management system, such as on, near, or at least partially in the phase change material, such as at the base of the phase change material, such as to enhance energy propagation throughout the phase change material. The addition of this heat spreading material can increase the temperature stability in the phase change material and can reduce a cross-module temperature variation (e.g., temperature variation between multiple components managed by the same thermal management system). This heat spreading material can be beneficial in embodiments in which the phase change material has a low thermal conductivity (e.g., an organic material, such as paraffin wax) and may not be in some embodiments if the phase change material has a high conductivity (e.g. a metal with a low-melt point). The heat spreading material can be near or in contact with multiple phase change materials, such as to spread heat across multiple such materials and help retain the materials at a homogenous temperature.

One or more embodiment provide the ability to pre-heat one or more components or interconnects (e.g., connections 226, ports 224, 222, and/or 430, and so forth) to the required temperature, prior to using the interconnect, to perform operations for the associated device or system. The system can be brought up from a cold-start by getting the entire thermal module's material into a two-phase state, such as to allow the interconnect and the component to operate at the transition temperature. As part of system start-up, the heat source can bring the phase change material into the two-phase region, enabling operation of the component. Once the system begins to operate the energy dissipated by the component can help keep the system from getting too cool and reverting to a single phase material.

One or more systems discussed herein include the ability to maintain physically disparate components at the same stable temperatures, such as to within tenths of a degree Celsius. Currently available performance for sensor to sensor variation is greater than the temperature stability provided by such systems. Even with current high precision thermal sensors temperature repeatability from component to component may not provide such temperature stability as one or more systems discussed herein.

ADDITIONAL NOTES

The present subject matter may be described by way of several examples.

Example 1 may include or use subject matter (such as an apparatus, a method, a means for performing acts, or a device readable memory including instructions that, when performed by the device, may configure the device to perform acts), such as may include or use an apparatus comprising a phase change material substantially at a phase transition temperature of the phase change material, a component near, on, or at least partially in the phase change material, and a heat removal device to transfer heat energy away from the phase change material and maintain the phase change material substantially at the phase transition temperature.

Example 2 can include or use, or can optionally be combined with the subject matter of Example 1, to include or use a sensor near, on, or at least partially in the phase change material to measure a property of the phase change material and provide signals indicating a value of the property to control circuitry.

Example 3 can include or use, or can optionally be combined with the subject matter of Example 2, to include or use, wherein the sensor is a conductivity sensor and the property is an electrical conductance of the phase change material.

Example 4 can include or use, or can optionally be combined with the subject matter of Example 2, to include or use, wherein the sensor is a pressure sensor and the property is a density of the phase change material.

Example 5 can include or use, or can optionally be combined with the subject matter of at least one of Examples 1-4, to include or use, wherein the component is a silicon photonics component and the system further comprises an optical waveguide near, on, or at least partially in the phase change material to guide light to the silicon photonics component.

Example 6 can include or use, or can optionally be combined with the subject matter of Example 5, to include or use, wherein the silicon photonics component is an optical resonator.

Example 7 can include or use, or can optionally be combined with the subject matter of at least one of Examples 1-6, to include or use a heat source to transfer heat to the phase change material.

Example 8 can include or use, or can optionally be combined with the subject matter of at least one of Examples 1-7, to include or use a heat spreader device to disperse heat energy within the phase change material.

Example 9 can include or use, or can optionally be combined with the subject matter of at least one of Examples 1-8, to include or use control circuitry electrically coupled to the heat source and a sensor, the sensor near, on, or at least partially in the phase change material, the control circuitry to receive one or more signals from the sensor and provide control signals to the heat source to alter an amount of heat energy provided by the heat source in response to the one or more signals from the sensor and to maintain the phase change material at the phase transition temperature.

Example 10 can include or use, or can optionally be combined with the subject matter of Example 9, to include or use, wherein the control circuitry is electrically coupled to a heat removal device and the control circuitry is further to provide control signals to the heat removal device to alter an amount of heat energy removed by the heat removal device in response to the one or more signals from the sensor and to maintain the phase change material at the phase transition temperature.

Example 11 may include or use subject matter (such as an apparatus, a method, a means for performing acts, or a device readable memory including instructions that, when performed by the device, may configure the device to perform acts), such as may include or use a method comprising detecting, using a sensor, a property of a phase change material, providing, by the sensor, one or more signals indicating a value of the detected property to control circuitry, and providing, using the control circuitry, one or more control signals to a heat removal device to adjust an amount of heat energy transferred away from the phase change material to maintain the phase change material at a phase transition temperature, and maintain a temperature of a component on, near, or at least partially in the phase change material at the phase transition temperature.

Example 12 can include or use, or can optionally be combined with the subject matter of Example 11, to include or use, wherein the component is a silicon photonics component and the method further comprises receiving, at an optical waveguide, light from a light source and guiding, by the optical waveguide, the light to the silicon photonics component.

Example 13 can include or use, or can optionally be combined with the subject matter of at least one of Examples 11-12, to include or use, providing, using the control circuitry, one or more control signals to a heat source to adjust an amount of heat energy provided to the phase change material by the heat source to maintain the phase change material at the phase transition temperature, and maintain the temperature of the component on, near, or at least partially in the phase change material at the phase transition temperature.

Example 14 can include or use, or can optionally be combined with the subject matter of at least one of Examples 11-13, to include or use dispersing heat energy from the heat source in the phase change material using a heat spreader.

Example 15 can include or use, or can optionally be combined with the subject matter of at least one of Examples 11-14, to include or use, wherein the sensor is one of (1) a pressure sensor and the property of the phase change material is a density and (2) a resistivity sensor and the property of the phase change material is a conductivity.

Example 16 may include or use subject matter (such as an apparatus, a method, a means for performing acts, or a device readable memory including instructions that, when performed by the device, may configure the device to perform acts), such as may include or use a system comprising a phase change material, a component near, on, or at least partially in the phase change material, a heat source to provide heat energy to the phase change material, control circuitry electrically coupled to the heat source, a sensor near, on, or at least partially in the phase change material and electrically coupled to the control circuitry, the sensor to measure a property of the phase change material and provide one or more signals indicating a value of the property to the control circuitry, and the control circuitry to provide one or more control signals to the heat source to alter the amount of heat energy provided by the heat source and maintain the phase change material at a phase transition temperature.

Example 17 can include or use, or can optionally be combined with the subject matter of Example 16, to include or use a heat removal device to transfer heat away from the phase change material, the heat removal device electrically coupled to the control circuitry, the control circuitry to further provide one or more control signals to the heat removal device to alter an amount of heat energy transferred away from the phase change material based on the one or more signals provided by the sensor.

Example 18 can include or use, or can optionally be combined with the subject matter of at least one of Examples 16-17, to include or use a heat spreader device near, on, or at least partially in the phase change material to disperse heat energy within the phase change material.

Example 19 can include or use, or can optionally be combined with the subject matter of at least one of Examples 16-18, to include or use, wherein the sensor is one of (1) a conductivity sensor and the property is an electrical conductivity of the phase change material and (2) a pressure sensor and the property is a density of the phase change material.

Example 20 can include or use, or can optionally be combined with the subject matter of at least one of Examples 16-19, to include or use, wherein the component is a silicon photonics component and the system further comprises an optical waveguide to guide light to the silicon photonics component.

Example 21 may include or use subject matter (such as an apparatus, a method, a means for performing acts, or a device readable memory including instructions that, when performed by the device, may configure the device to perform acts), such as may include or use a system comprising a first phase change material, a first component near, on, or at least partially in the first phase change material, a first heat removal device to transfer heat energy away from the first phase change material, first control circuitry electrically coupled to the first heat removal device, a first sensor near, on, or at least partially in the first phase change material and electrically coupled to the first control circuitry, the first sensor to measure a property of the first phase change material and provide one or more signals indicating a value of the property to the first control circuitry, the first control circuitry to provide one or more control signals to the first heat removal device to alter the amount of heat energy transferred away by the heat removal device and maintain the first phase change material at a phase transition temperature, a second phase change material, a second component near, on, or at least partially in the second phase change material, a second heat removal device to transfer heat energy away from the second phase change material, second control circuitry electrically coupled to the second heat removal device, a second sensor near, on, or at least partially in the second phase change material and electrically coupled to the second control circuitry, the second sensor to measure a property of the second phase change material and provide one or more signals indicating a value of the property to the second control circuitry, the second control circuitry to provide one or more control signals to the second heat removal device to alter the amount of heat energy transferred away by the second heat removal device and maintain the second phase change material at the phase transition temperature, and an optical waveguide coupled to the first component and the second component and at least partially embedded in the first and second phase change materials.

Example 22 can include or use, or can optionally be combined with the subject matter of Example 21, to include or use a first heat source electrically coupled to the first control circuitry and a second heat source electrically coupled to the second control circuitry to provide heat energy to the first and second phase change materials, respectively, the first and second control circuitry to further provide one or more control signals to the first and second heat sources to alter an amount of heat energy provided to the phase change material based on the one or more signals provided by the first and second sensors, respectively.

Example 23 can include or use, or can optionally be combined with the subject matter of at least one of Examples 21-22, to include or use one or more of a first heat spreader device near, on, or at least partially in the first phase change material to disperse heat energy within the first phase change material and a second heat spreader device near, on, or at least partially in the second phase change material to disperse heat energy within the second phase change material.

Example 24 can include or use, or can optionally be combined with the subject matter of at least one of Examples 21-23, to include or use wherein the first and second sensors are one of (1) a conductivity sensor and the property is an electrical conductivity of the phase change material and (2) a pressure sensor and the property is a density of the phase change material.

Example 25 can include or use, or can optionally be combined with the subject matter of at least one of Examples 21-24, to include or use, wherein the first and second components are silicon photonics components and the system further comprises an optical waveguide to guide light to the silicon photonics component.

Example 26 can include or use, or can optionally be combined with the subject matter of at least one of Examples 21-25, to include or use, wherein the first and second phase change material are the same type of material and the first and second sensors are the same type of sensors.

Example 27 may include or use subject matter (such as an apparatus, a method, a means for performing acts, or a device readable memory including instructions that, when performed by the device, may configure the device to perform acts), such as may include or use a method of keeping multiple components at a generally homogenous temperature comprising detecting, using a first sensor, a property of a first phase change material, providing, by the first sensor, one or more signals indicating a value of the detected property to control circuitry, detecting, using a second sensor, a property of a second phase change material, providing, by the second sensor, one or more signals indicating a value of the detected property to the control circuitry, providing, using the control circuitry, one or more first control signals to a first heat removal device to adjust an amount of heat energy transferred away from the first phase change material by the first heat removal device to maintain the first phase change material at a phase transition temperature, and maintain a temperature of a first component on, near, or at least partially in the first phase change material at the phase transition temperature, and providing, using the control circuitry, one or more second control signals to a second heat removal device to adjust an amount of heat energy transferred away from the second phase change material by the second heat removal device to maintain the second phase change material at the phase transition temperature, and maintain a temperature of a second component on, near, or at least partially in the second phase change material at the phase transition temperature.

Example 28 can include or use, or can optionally be combined with the subject matter of Example 27, to include or use, wherein the first and second components are silicon photonics components and the method further comprises receiving, at an optical waveguide, light from first silicon photonics component and guiding, by the optical waveguide, the light to the second silicon photonics component, wherein the optical waveguide is at least partially embedded in the first and second phase change materials.

Example 29 can include or use, or can optionally be combined with the subject matter of at least one of Examples 27-28, to include or use providing, using the control circuitry, one or more control signals to a heat source to adjust an amount of heat energy provided to one or more of the first phase change material and second phase change material by the heat source to maintain one or more of the first phase change material and the second phase change material at the phase transition temperature, and maintain the temperature of one or more of the first component and second component on, near, or at least partially in the first phase change material or second phase change material, respectively at the phase transition temperature.

Example 30 can include or use, or can optionally be combined with the subject matter of at least one of Examples 27-29, to include or use dispersing heat energy from the heat source in one or more of the first phase change material and second phase change material using a heat spreader.

Example 31 can include or use, or can optionally be combined with the subject matter of at least one of Examples 27-30, to include or use, wherein the first sensor second sensor are one of (1) a pressure sensor and the property of the first and second phase change materials is a density and (2) a resistivity sensor and the property of the first and second phase change materials is a conductivity.

The above detailed description includes references to the accompanying drawings, which form a part of the detailed description. The drawings show, by way of illustration, specific embodiments in which methods, apparatuses, and systems discussed herein may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

As used herein, a "-" (dash) used when referring to a reference number means "or", in the non-exclusive sense discussed in the previous paragraph, of all elements within the range indicated by the dash. For example, 103A-B means a nonexclusive "or" of the elements in the range {103A, 103B}, such that 103A-103B includes "103A but not 103B", "103B but not 103A", and "103A and 103B".

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

What is claimed is:

1. An apparatus comprising:
   a phase change material substantially at a phase transition temperature of the phase change material;
   a silicon photonics component near, on, or at least partially in the phase change material;
   an optical waveguide near, on, or at least partially in the phase change material to guide light to the silicon photonics component; and
   a heat removal device to transfer heat away from the phase change material.

2. The apparatus of claim 1, further comprising:
   a sensor near, on, or at least partially in the phase change material to measure a property of the phase change material and provide signals indicating a value of the property to control circuitry.

3. The apparatus of claim 2, wherein the sensor is a conductivity sensor and the property is an electrical conductance of the phase change material.

4. The apparatus of claim 2, wherein the sensor is a pressure sensor and the property is a density of the phase change material.

5. The apparatus of claim 1, wherein the silicon photonics component is an optical resonator.

6. The apparatus of claim 1, further comprising a heat source to provide heat energy to the phase change material.

7. The apparatus of claim 1, further comprising a heat spreader device to disperse heat energy within the phase change material.

8. An apparatus comprising:
   a phase change material substantially at a phase transition temperature of the phase change material;
   a silicon photonics component near, on, or at least partially in the phase change material;
   an optical waveguide near, on, or at least partially in the phase change material to guide light to the silicon photonics component;
   a heat removal device to transfer heat away from the phase change material; and
   control circuitry electrically coupled to the heat source and a sensor, the sensor near, on, or at least partially in the phase change material, the control circuitry to receive one or more signals from the sensor and provide control signals to the heat source to alter an amount of heat energy provided by the heat source in response to the one or more signals from the sensor and to maintain the phase change material at the phase transition temperature.

9. The apparatus of claim 8, wherein the control circuitry is electrically coupled to a heat removal device and the control circuitry is further to provide control signals to the heat removal device to alter an amount of heat energy removed by the heat removal device in response to the one or more signals from the sensor and to maintain the phase change material at the phase transition temperature.

10. A method comprising:
sensing, using a sensor, a property of a phase change material;
providing, by the sensor, one or more signals indicating a value of the detected property to control circuitry;
guiding, by an optical waveguide near, on, or at least partially in the phase change material to light to a silicon photonics component; and
providing, using the control circuitry, one or more control signals to a heat removal device to adjust an amount of heat energy transferred away from the phase change material by the heat removal device to maintain the phase change material at a phase transition temperature, and maintain a temperature of the silicon photonics component on, near, or at least partially in the phase change material at the phase transition temperature.

11. The method of claim 10, further comprising:
providing, using the control circuitry, one or more control signals to a heat source to adjust an amount of heat energy provided to the phase change material by the heat source to maintain the phase change material at the phase transition temperature, and maintain the temperature of the component on, near, or at least partially in the phase change material at the phase transition temperature.

12. The method of claim 10, further comprising:
dispersing heat energy from the heat source in the phase change material using a heat spreader.

13. The method of claim 10, wherein the sensor is one of (1) a pressure sensor and the property of the phase change material is a density and (2) a resistivity sensor and the property of the phase change material is a conductivity.

14. A system comprising:
a phase change material;
a silicon photonics component near, on, or at least partially in the phase change material;
an optical waveguide near, on, or at least partially in the phase change material to guide light to the silicon photonics component;
a heat source to provide heat energy to the phase change material;
control circuitry electrically coupled to the heat source;
a sensor near, on, or at least partially in the phase change material and electrically coupled to the control circuitry, the sensor to measure a property of the phase change material and provide one or more signals indicating a value of the property to the control circuitry; and
the control circuitry to provide one or more control signals to the heat source to alter the amount of heat energy provided by the heat source and maintain the phase change material at a phase transition temperature.

15. The system of claim 14, further comprising a heat removal device to transfer heat away from the phase change material, the heat removal device electrically coupled to the control circuitry, the control circuitry to further provide one or more control signals to the heat removal device to alter an amount of heat energy transferred away from the phase change material based on the one or more signals provided by the sensor.

16. The system of claim 14, further comprising a heat spreader device near, on, or at least partially in the phase change material to disperse heat energy within the phase change material.

17. The system of claim 14, wherein the sensor is one of (1) a conductivity sensor and the property is an electrical conductivity of the phase change material and (2) a pressure sensor and the property is a density of the phase change material.

18. A system comprising:
a first phase change material;
a first silicon photonics component near, on, or at least partially in the first phase change material;
an optical waveguide near, on, or at least partially in the phase change material to guide light to the silicon photonics component;
a first heat removal device to transfer heat energy away from the first phase change material;
first control circuitry electrically coupled to the first heat removal device;
a first sensor near, on, or at least partially in the first phase change material and electrically coupled to the first control circuitry, the first sensor to measure a property of the first phase change material and provide one or more signals indicating a value of the property to the first control circuitry;
the first control circuitry to provide one or more control signals to the first heat removal device to alter the amount of heat energy transferred away by the heat removal device and maintain the first phase change material at a phase transition temperature;
a second phase change material;
a second optical component near, on, or at least partially in the second phase change material;
a second heat removal device to transfer heat energy away from the second phase change material;
second control circuitry electrically coupled to the second heat removal device;
a second sensor near, on, or at least partially in the second phase change material and electrically coupled to the second control circuitry, the second sensor to measure a property of the second phase change material and provide one or more signals indicating a value of the property to the second control circuitry;
the second control circuitry to provide one or more control signals to the second heat removal device to alter the amount of heat energy transferred away by the second heat removal device and maintain the second phase change material at the phase transition temperature; and
an optical waveguide coupled to the first optical component and the second optical component and at least partially embedded in the first and second phase change materials.

19. The system of claim 18, further comprising a first heat source electrically coupled to the first control circuitry and a second heat source electrically coupled to the second control circuitry to provide heat energy to the first and second phase change materials, respectively, the first and second control circuitry to further provide one or more control signals to the first and second heat sources to alter an amount of heat energy provided to the phase change material based on the one or more signals provided by the first and second sensors, respectively.

20. The system of claim 18, further comprising one or more of a first heat spreader device near, on, or at least partially in the first phase change material to disperse heat energy within the first phase change material and a second heat spreader device near, on, or at least partially in the second phase change material to disperse heat energy within the second phase change material.

21. The system of claim 18, wherein the first and second sensors are one of (1) a conductivity sensor and the property is an electrical conductivity of the phase change material and (2) a pressure sensor and the property is a density of the phase change material.

22. The system of claim 18, wherein the first and second optical component is a silicon photonics component, and the first and second phase change material are the same type of material and the first and second sensors are the same type of sensors.

* * * * *

UNITED STATES PATENT AND TRADEMARK OFFICE
CERTIFICATE OF CORRECTION

PATENT NO.        : 10,295,283 B2
APPLICATION NO.   : 14/974801
DATED             : May 21, 2019
INVENTOR(S)       : Patterson et al.

Page 1 of 1

It is certified that error appears in the above-identified patent and that said Letters Patent is hereby corrected as shown below:

In the Claims

In Column 21, Line 4, in Claim 22, before "second", delete "first and"

Signed and Sealed this
Twenty-first Day of April, 2020

Andrei Iancu
*Director of the United States Patent and Trademark Office*